United States Patent [19]

Gaudronneau

[11] Patent Number: 4,908,799
[45] Date of Patent: Mar. 13, 1990

[54] DEVICE TO DETECT THE FUNCTIONING OF THE READ SYSTEM OF AN EPROM OR EEPROM MEMORY CELL

[75] Inventor: Yann Gaudronneau, Aubane, France

[73] Assignee: Thomson Composants Militaires Et Spatiaux, Paris, France

[21] Appl. No.: 316,538

[22] Filed: Feb. 27, 1989

Related U.S. Application Data

[63] Continuation of Ser. No. 64,019, Jun. 19, 1987, abandoned.

[30] Foreign Application Priority Data

Jun. 24, 1986 [FR] France .................. 86 09103

[51] Int. Cl.⁴ .................. G11C 29/00; G11C 7/00
[52] U.S. Cl. .................. 365/241; 365/189.09; 365/228; 365/195; 365/185
[58] Field of Search .................. 365/241, 185, 189.09, 365/226, 228, 195, 218

[56] References Cited

U.S. PATENT DOCUMENTS

| | | | |
|---|---|---|---|
| 3,539,839 | 1/1967 | Igarashi | 365/228 |
| 4,399,519 | 8/1983 | Masuda et al. | 365/149 |
| 4,399,521 | 8/1983 | Masuda | 365/149 |
| 4,612,632 | 9/1986 | Olson | 365/226 X |
| 4,649,520 | 3/1987 | Eitan | 365/185 |
| 4,669,063 | 5/1987 | Kirsch | 365/149 |
| 4,694,427 | 9/1987 | Miyamoto et al. | 365/185 X |
| 4,747,079 | 5/1988 | Yamaguchi | 365/18 X |
| 4,791,612 | 12/1988 | Yoshida | 365/189.09 |

FOREIGN PATENT DOCUMENTS

| | | | |
|---|---|---|---|
| 0045215 | 2/1982 | European Pat. Off. | 365/149 |
| 0139196 | 5/1985 | European Pat. Off. | 365/149 |
| 0144710 | 6/1985 | European Pat. Off. | 365/149 |
| 1237928 | 7/1986 | Fed. Rep. of Germany | 365/149 |
| 62-275396 | 11/1987 | Japan | 365/218 |
| 2107544 | 4/1983 | United Kingdom | 365/149 |

OTHER PUBLICATIONS

Patents Abstracts of Japan, vol. 7, No. 164 (P-211) [1309], 19 Jul. 1983; & JP-A-58 70 486 (Nippon Denki K.K.) 26-04-83.
Patents Abstracts of Japan, vol. 6, No. 38 (P-105) [916], 9 Mar. 1982; & JP-A-56 156 992 (Matsushita Denki Sangyo K.K.) 03-12-1981.
Patents Abstracts of Japan, vol. 6, No. 221 (P-153) [1099], 5 Nov. 1982; & JP-A-57 123 594 (Matsushita Denki Sangyo K.K.) 02-08-1982.
Patents Abstracts of Japan, vol. 7, No. 196 (P-219) [1341], 26 Aout 1983; & JP-A-58 94 195 (Shin Nippon Denki K.K.) 04-06-1983.
Patents Abstracts of Japan, vol. 1, No. 32 (E-76) [1401], 29-03-77; & JP-A-51 126 732 (Hitachi Seisakusho K.K.) 05-11-1976.

*Primary Examiner*—Stuart N. Hecker
*Assistant Examiner*—Alfonso Garcia
*Attorney, Agent, or Firm*—Oblon, Spivak, McClelland, Maier & Neustadt

[57] ABSTRACT

An electrically programmable read only memory including an inhibiting circuit for preventing operation of the memory if a reading voltage higher than a predetermined level above a standard reading voltage is applied as a reading voltage during a read operation. The inhibiting circuit includes a detection circuit for providing a detection signal in the event that a reading voltage higher than the standard reading voltage is applied to the memory, and a logic circuit connected to an output of the detection circuit and having an output supplied as an inhibiting signal, for example, to inhibit a clock signal within the integrated circuit, upon reception of the detection signal. In a preferred embodiment, the detection circuit includes an enhanced-type transistor connected in series with a depleted transistor serving as a load. The enhanced transistor has a channel ranging between 50 and 100 microns and a channel length ranging from 4 to 6 microns.

7 Claims, 2 Drawing Sheets

FIG_1-a
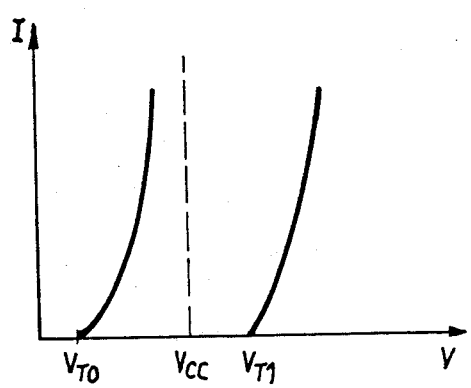
FIG_1-b
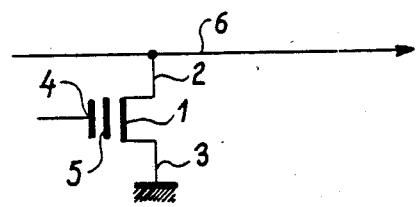
FIG_2
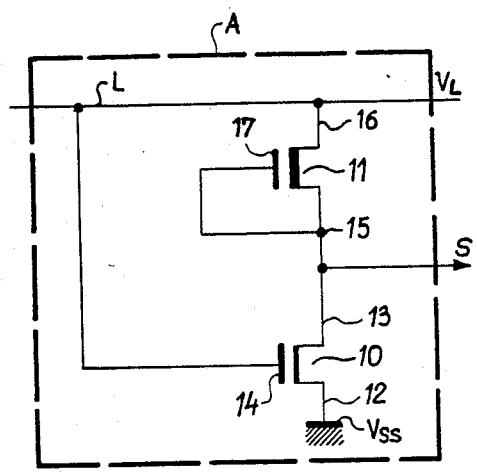
FIG_3
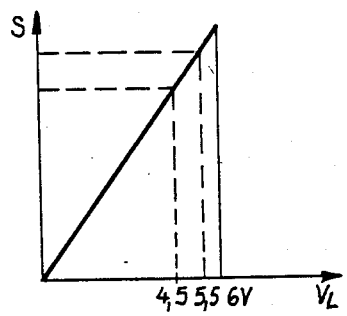
FIG_5
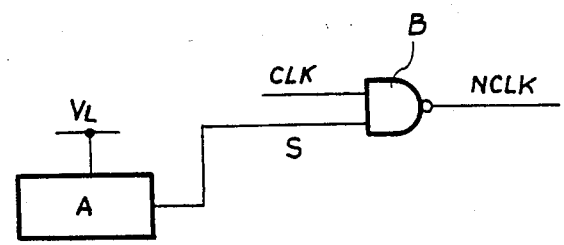

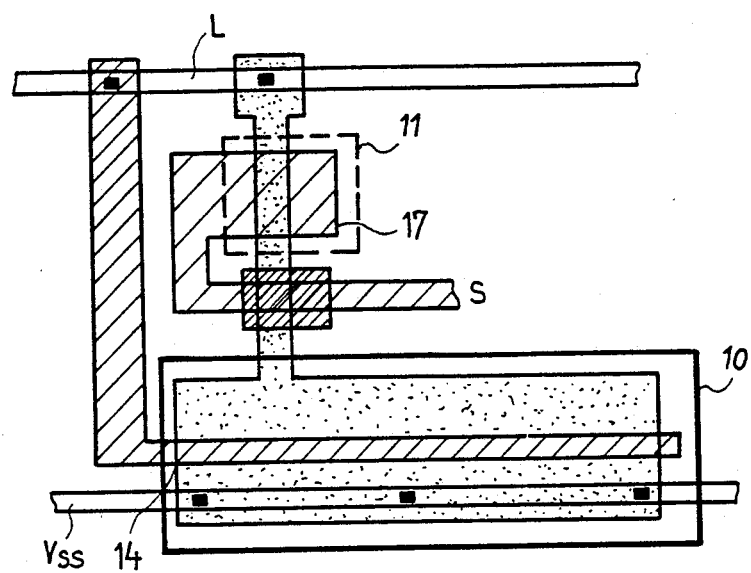
FIG_4

DEVICE TO DETECT THE FUNCTIONING OF THE READ SYSTEM OF AN EPROM OR EEPROM MEMORY CELL

This application is a continuation of application Ser. No. 064,019, filed on 06/19/87, now abandoned.

BACKGROUND OF THE INVENTION

The present invention pertains to a device to detect the functioning of the read system of an EPROM or EEPROM memory cell.

Certain integrated circuits presently available on the market are made with an electrically programmable non-volatile memory in which, most usually, non-modifiable data are recorded. Now, the electrically programmable non-volatile memories used in these integrated circuits are generally memories of the EPROM or EEPROM type.

In memories of the above type, each data storage element or memory cell comprises a floating gate MOS transistor, which may be mainly of the FAMOS (floating gate avalanche injection MOS) or SAMOS (stacked gate avalanche injection MOS) type. The above MOS transistor has two states. For an N-channel MOS transistor, in a first state, no charge is trapped at the floating gate. There may be a conduction channel between the source and the drain. The transistor is then conductive and behaves like a closed switch. In a second state, electrons have been trapped at the floating gate. They prevent the creation of a conduction channel in the substrate between the source and the drain. In this case, the transistor is off and behaves like an open switch.

To programme a MOS transistor 1 of the type shown in FIG. 1B, voltages higher than the normal operating voltage are appropriately applied to the control gate 4 and the electrode 2 in such a way that the floating gate 5 absorbs and keeps a charge of electrons. This charge of electrons at the floating gate 5 raises the conduction threshold at the control gate 4 of the transistor, from the minimum threshold $V_{T0}$ of the non-programmed transistors to a higher threshold voltage $V_{T1}$, as shown in FIG. 1A which gives the graph of the operating characteristic of a SAMOS type floating gate transistor.

To read a memory thus programmed, a voltage Vcc, smaller than the threshold voltage $V_{T1}$ of the programmed transistors but higher than the minimum voltage $V_{T0}$ of the non-programmed transistors, must be applied to the control gate. This read voltage is used to ascertain that the transistor is on or off. As shown in FIG. 1B, in general, the transistor 1 is connected by the electrode 2 to a bit line 6 which is voltage biased by a generator. The other electrode 3 of the transistor is connected to the ground. The bit line 6 is also connected to a current sensor which is not shown. This sensor measures the current put through the line by the generator. If the memory cell has not been programmed, the transistor is on, and when the read voltage Vcc, which is higher than $V_{T0}$, is applied, the transistor becomes saturated. A drop in current is detected on the sensor. In the second case, when the memory cell has been programmed, the charges are trapped at the floating gate of the transistor. The read voltage Vcc, applied to the control gate, is, in this case, in the opposite direction to the potential barrier created in the conduction channel by the charges stored in the floating gate. But this read voltage is then not enough to modify the conduction of the channel, and the transistor stays off. As a result, the sensor at the end of the bit line does not perceive the variation in current.

If, with the above memories, a voltage higher than the threshold voltage $V_{T1}$ is used for the read voltage Vcc, regardless of whether the memory cells are programmed or not, a current drop is detected on the sensors. Consequently, all the memory cells are read as if they were not programmed. It is therefore possible to read programmed memory cells as if they were not programmed. To remove this disadvantage, circuits with EPROM or EEPROM should not function with read voltages that are higher than the threshold voltage $V_{T1}$. Now, with currently available circuits, it is possible to apply a read voltage Vcc which is higher than the threshold voltage $V_{T1}$, without in any way modifying the functioning of the circuit.

The purpose of the present invention is to remove these disadvantages by proposing a device which enables the circuit to function for a read voltage ranging from $V_{T0}$ to $V_{T1}$ and which modifies the functioning of the circuit for a voltage which is slightly higher than this read voltage but is lower than the threshold voltage $V_{T1}$ of the programmed memory cells.

SUMMARY OF THE INVENTION

Consequently, the object of the present invention is a device to detect the functioning of the read system for an integrated circuit of the logic circuit type comprising a non-volatile memory containing data, the memory being made up of a matrix of memory cells of the type with MOS transistors which exhibit defined threshold voltages $V_{T0}$ and $V_{T1}$ depending on whether they are programmed at "0" or at "1", the said memory cells being read by applying a read voltage $V_L$ such that, in normal functioning, $V_{T0} < V_L < V_{T1}$, the device comprising an inverter having an enhanced MOS type signal transistor that exhibits a threshold voltage $V_T$ such that $V_L < V_T < V_{T1}$, the gate of which is connected to a line to which the read voltage is applied, and having a load connected to the same line as the gate, the inverter giving a logic signal which is used to modify the functioning of the integrated circuit when the read voltage applied is higher than the threshold voltage $V_T$.

According to a preferred embodiment, the load comprises a depleted MOS transistor, the gate of which is connected to the source.

Furthermore, to obtain a clear logic signal, the width W of the signal transistor is great with respect to its length, so that it is not sensitive to variations in the W/L ratio or variations in the resistance of the load transistor. Thus, the width of the signal transistor ranges between 50 and 100 microns, preferably 100 microns for a length of 4 to 6 microns in NMOS technology.

According to another characteristic of the present invention, the output logic signal of the inverter is sent to a gate which receives, at another input, a signal needed for the functioning of the integrated circuit, such as the clock signal, so as to stop or modify the functioning of the said circuit when the read voltage applied is higher than the threshold voltage $V_T$.

BRIEF DESCRIPTION OF THE DRAWINGS

Other characteristics and advantages of the present invention will appear from the following description of an embodiment made with reference to the appended drawings, of which:

FIGS. 1A and 1B, already described, respectively show the voltage/current characteristic of a memory cell with a floating gate transistor and the memory cell.

FIG. 2 is a circuit diagram of a detection device according to the present invention, FIG. 3 shows the transfer curve of the circuit of FIG. 2, FIG. 4 shows a top view of the logic layout of the circuit of FIG. 2, and FIG. 5 is a schematic view of a circuit used to detect the functioning of the circuit using the circuit of FIG. 2.

The present invention will be described with reference to N-channel MOS transistors such as electrically programmable non-volatile memory transistors, for this corresponds to the most commonly used technology. It is clear to the specialist that this invention can easily be transposed to P-channel MOS transistors.

DESCRIPTION OF THE PREFERRED EMBODIMENT

As shown in FIGS. 2 and 4, the detection device according to the present invention comprises essentially an enhanced MOS transistor 10, with one of its electrodes 12 connected to the ground Vss and the other electrode 13 connected to a load which will be described further below. The gate 14 of this MOS transistor is connected to the line L which receives the input signal which, in the present case, comprises the read voltage $V_L$. According to the present invention, the enhanced MOS transistor 10 has been made so that it has a specific threshold voltage $V_T$. This threshold voltage $V_T$ ranges between $V_L$ and $V_{T1}$, with $V_{T1}$ corresponding to the threshold voltage of the floating gate MOS transistors forming the memory cells programmed at "1", and $V_L$ corresponding to Vcc or a fraction of Vcc. For example, with a $V_L$ which may vary between 4.5 and 5.5 volts, the voltage $V_T$ can be chosen as being equal to 6 volts, $V_{T1}$ generally being about 7 volts. The use of an enriched MOS transistor with a specific threshold voltage makes it possible to detect the passage of the reading voltage above the threshold voltage with certainty. For the threshold voltage $V_T$ is given with a precision of +0.3 volts in commonly used technologies, and this is one of the main advantages of this type of device.

Furthermore, according to the preferred embodiment of the present invention shown in FIGS. 2 and 4, the load comprises a depleted MOS transistor 11. This transistor comprises an electrode 15 connected to the electrode 13, with its other electrode 16 connected to the voltage $V_L$. In a known way, the gate 17 is connected to the electrode 15 so that the voltage $V_{GS}=0$. The output S is taken at a middle point between the electrodes 13 and 15.

With the circuit shown in FIG. 2, as long as the voltage $V_L$ is lower than $V_T$, the transistor 10 is off and the transistor 11 works in the triode mode. In the normal range of functioning of the circuit, i.e. where $V_L$ ranges between 4.5 volts and 5.5 volts, the output S gives a logic signal "1". For a voltage $V_L$ higher than $V_T$, the transistor 10 goes into the triode mode and the transistor 11 into the saturated mode, and an output signal S, corresponding to the logic state "0", is got.

The transfer curve of a circuit of this kind is of the type shown in FIG. 3. To obtain a steep slope at the passage from the logic state "1" to the logic state "0", it is important for the W/L ratio of the signal transistor to be high. Thus, the width W of the transistor 10 ranges between 50 and 100 microns while its length ranges from 4 to 6 microns. With these characteristics, the signal transistor 10 is insensitive to variations in the W/L ratio or in the resistance of the transistor 11. These characteristics are shown more especially in FIG. 4. Furthermore, in FIG. 4, the speckled portions represent the diffusion, the hatched portions represent the gates and their interconnections with the conductors, and the dark squares represent the metal/diffusion or metal/metal contacts. The dots and dashes represent the depletion implant and the thick lines represent the special implant to obtain a threshold voltage of about 6 volts.

Furthermore, as is shown in FIG. 5 by way of example, the logic signal from the output S of the detection circuit A according to the present invention is sent to one of the inputs of an AND gate B, which receives the clock signal CLK at its other input. At the output of the gate B, a signal CLK or an inhibition of the signal CLK is obtained depending on the signal S. For if S is at "1", the signal CLK is transmitted through the gate B, but if S is at "0", the signal CLK is not transmitted, thus stopping the functioning of the circuit. It is obvious to the specialist that the detection device A could be placed at other parts of the circuit, provided that it is placed before the fuse. Other signals than the clock signal, working on the functioning of the circuit, can be used to modify or inhibit its functioning.

The above circuit has the advantage of being very simply designed. It requires only one additional mask level. Furthermore, the voltage $V_T$ is fixed since it is determined by the embodiment itself of the transistor 10.

It is obvious to the specialist that the present invention can be applied to all memories for which a point is read in the same way as in EPROMs or EEPROMs.

What is claimed is:

1. An integrated circuit comprising:
    a memory circuit having electrically programmable read-only memory cells, each of said cells comprising a transistor having a first or second threshold voltage VT0 or VT1, depending upon whether the cell is programmed or not, said cells being readable upon application of a normal reading supply voltage Vcc between VT0 and VT1 during a read operation;
    inhibiting means for preventing operation of the memory cells if a voltage higher than a predetermined level is applied as a reading voltage during a read operation, said predetermined level being between Vcc and the higher of VT0 and VT1,
    wherein said inhibiting means comprises,
    detection means for providing a detection signal in case a voltage higher than said predetermined level is applied as a reading voltage, and
    logical means connected to an output of said detection means and having an output for supplying an inhibiting signal within the integrated circuit upon reception of the detection signal.

2. An integrated circuit according to claim 1, wherein said detection means comprises:
    a series circuit including an enhanced-type transistor connected in series with a load, said series circuit receiving the reading voltage applied to the memory circuit, the gate of said transistor also receiving said reading voltage, said transistor having a threshold voltage equal to said predetermined level, and said predetermined level being higher than a standard reading voltage to be used for reading the memory.

3. An integrated circuit according to claim 1, wherein said logical means comprises:
   a logical gate receiving an output of the detection means and receiving a clock signal, said gate preventing further transmission of the clock signal within the integrated circuit upon reception of a detection signal from the detection means.

4. An integrated circuit according to claim 2, wherein said logical means comprises:
   a logical gate receiving an output of the detection means and receiving a clock signal, said gate preventing further transmission of the clock signal within the integrated circuit upon reception of a detection signal from the detection means.

5. An integrated circuit according to claim 2, wherein said load comprises:
   a depleted transistor having a gate electrode and a source, said gate electrode connected to said source.

6. An integrated circuit according to claim 5, wherein said enhanced transistor has a channel width several times greater than its channel length.

7. An integrated circuit according to claim 6, wherein said channel width ranges between 50 and 100 microns, and said channel length ranges from 4 to 6 microns.

* * * * *